United States Patent
Bhatt et al.

(10) Patent No.: US 6,608,757 B1
(45) Date of Patent: Aug. 19, 2003

(54) METHOD FOR MAKING A PRINTED WIRING BOARD

(75) Inventors: Anilkumar C. Bhatt, Johnson City, NY (US); Ashwinkumar C. Bhatt, Endicott, NY (US); Subahu D. Desai, Vestal, NY (US); John M. Lauffer, Waverly, NY (US); Voya R. Markovich, Endwell, NY (US); Thomas R. Miller, Endwell, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/101,277

(22) Filed: Mar. 18, 2002

(51) Int. Cl.[7] .............................. H05K 7/16; H05K 1/14; H05K 7/10; H05K 1/00; H01R 12/04
(52) U.S. Cl. .................. 361/748; 361/720; 361/719; 361/736; 361/765; 361/760; 174/250; 174/260; 174/255; 174/264; 174/261; 174/262
(58) Field of Search ................................ 174/255, 264, 174/261, 262; 29/842; 361/748; 257/686

(56) References Cited

U.S. PATENT DOCUMENTS

| | | | | |
|---|---|---|---|---|
| 4,069,076 A | | 1/1978 | Fickes ........................ 156/83 |
| 4,657,839 A | | 4/1987 | Sullivan ..................... 430/258 |
| 4,854,038 A | | 8/1989 | Wiley ......................... 29/830 |
| 5,026,624 A | * | 6/1991 | Day et al. ................. 430/280.1 |
| 5,300,402 A | | 4/1994 | Card, Jr. et al. ............ 430/280 |
| 5,700,607 A | | 12/1997 | Rath et al. ................... 430/15 |
| 5,822,856 A | * | 10/1998 | Bhatt et al. ................. 174/262 |
| 5,928,839 A | | 7/1999 | Rath et al. .................. 430/313 |
| 6,015,520 A | * | 1/2000 | Appelt et al. ............... 264/104 |
| 6,110,643 A | | 8/2000 | Rath et al. ............... 430/280.1 |
| 6,175,087 B1 | * | 1/2001 | Keesler et al. ............. 174/261 |
| 6,199,273 B1 | * | 3/2001 | Kubo et al. ................ 174/250 |
| 6,204,453 B1 | * | 3/2001 | Fallon et al. .............. 174/255 |
| 6,210,862 B1 | | 4/2001 | Day et al. ................ 430/280.1 |
| 6,211,320 B1 | | 4/2001 | Dershem et al. ......... 526/329.1 |
| 6,388,204 B1 | * | 5/2002 | Lauffer et al. .............. 174/255 |
| 2001/0042733 A1 | * | 11/2001 | Appelt et al. ................. 216/13 |

* cited by examiner

*Primary Examiner*—David E. Graybill
*Assistant Examiner*—James Mitchell
(74) *Attorney, Agent, or Firm*—Richard F. Frankeny; Winstead Sechrest & Minick P.C.; John R. Pivnichny

(57) ABSTRACT

Via holes are formed in an electrically conductive power plane. Photo-imageable dielectric (PID) material is applied to one side of the power plane filling the via holes. The power plane side with no PID material is exposed to light energy to cure the PID material in the via holes. A developer is used to remove any uncured PID material. Signal plane assemblies comprising a conductive signal plane and a dielectric layer are laminated onto the filled power plane forming a two signal and one power plane (2S1P) structure. In another embodiment, the power plane has PID material applied from both sides. A photo-mask is applied to the power plane and the PID material in the via holes is cured with light energy. A developer is used to remove uncured PID material. Signal plane assemblies, as described above, are laminated onto the filled power plane forming a 2S1P structure.

12 Claims, 7 Drawing Sheets

METHOD FOR MAKING A PRINTED WIRING BOARD

TECHNICAL FIELD

The present invention relates in general to printed wiring board structures and to methods for making printed wiring boards with thick inner-planes used for power distribution.

BACKGROUND INFORMATION

Printed wiring (circuit) boards (PWBs) have evolved over the years tracking the needs of circuit technologies they interconnect. In modern high performance computers, the PWB is designed for both high frequency signal distribution and the relatively high currents in power distribution. To manage high frequency signals, the PWB will have signal lines with controlled characteristic impedances and low noise coupling. Integrated circuits (ICs) used to implement high performance computers also have increasing numbers of input/output (I/O) connections, both for their wide data buses and for the requirement to provide low inductance power connections to minimize switching noise. The large numbers of I/O connections on an IC drives the requirement for the PWB to satisfy the corresponding high wiring demand resulting from the high via hole density around the IC. To service the wiring demand, the PWBs either increase the wiring density per wiring layer (thinner wiring lines) or add more wiring layers. In many cases, where PWBs are used in multiple chip assemblies, both thin wiring lines and large numbers of wiring layers are required.

The characteristic impedance of wiring lines used on a PWB is a function of the circuit line thickness, line width, and the dielectric thickness from the circuit line to a corresponding conductive reference plane. Typically, the voltage and ground power planes of the PWB serve as the reference planes for signal lines. Therefore, as the signal line widths become smaller, the dielectric thickness from the signal line to the power planes must also decrease if the characteristic impedance of the signal lines is to remain fixed. It is also desirable to have dielectric material with a low dielectric constant to improve signal propagation speed and to reduce noise coupling. A low dielectric constant also drives the thickness of the dielectric to be thinner for a given desired characteristic impedance.

To handle the increased power density for PWB assemblies used in high performance computers, the thicknesses of the power planes are also increasing. One popular structure for a PWB has two signal planes associated with a power plane (this is often referred to as a 2S1P structure). In a 2S1P PWB structure, each signal plane is separated from the power plane by a thickness of dielectric that is dictated by the required characteristic impedance of the signal lines the desired wiring capacity of the signal layer, and the dielectric constant of the dielectric material. Communication between signal planes requires conductive via holes that pass though the power planes.

In making the 2S1P PWB structure, signal via holes are first formed for the signals that must pass through the power plane. Typically, processes for forming via holes in a power plane comprise mechanical drilling, laser drilling, punching and chemical etching. The signal plane assemblies used to make the wiring layers may be fabricated by laminating an electrically conductive (e.g., copper) layer to a dielectric fabric (woven polymer cloth) layer that has been impregnated (sometimes referred to as Pre-Preg) with a flowable dielectric material. Two such signal plane assemblies are then laminated to the power plane with the pre-formed signal via holes. During lamination of the signal plane assemblies, the flowable dielectric in the Pre-Preg flows into both sides of the via holes in the power planes and fills the via holes. However, the requirement for thicker power planes and thinner signal plane dielectrics has forced the Pre-Preg layer to also be thinner to maintain a desired characteristic impedance. The combination of thinner Pre-Preg layers and thicker power planes has made it increasingly difficult to make high quality, high performance PWBs without forming voids in the dielectric within the signal via holes. This condition is observed in large via holes and in areas of high via hole density. Making a PWB with thick power planes in this prior art fashion has resulted in lower yields and in higher PWB failure rates.

There is therefore a need for a method for making high performance PWBs with thick power planes without sacrificing yields and quality.

SUMMARY OF THE INVENTION

A process for making high performance printed wiring boards (PWBs) separates the process for filling the via holes in the power planes from the process for making the signal dielectric layers that determine the electrical characteristics of the signal wiring lines. The signal via holes are first formed (e.g., drilled) in the power plane. In one embodiment, a photo-imageable dielectric (PID) material is applied to one side of the drilled power plane such that the PID material flows into the via holes. The PID material may be applied as a liquid by screen printing, draw coating, etc., or as a dry film using vacuum lamination. The filled power plane is then processed by exposing the un-coated side to light energy (e.g., ultra violet (UV) light). In this embodiment, the drilled power plane acts as a mask, allowing the light energy to only expose the PID material in the via holes. The PID material is a material that cures (e.g., cross-linking the polymer chains) such that it is resistant to a chemical developer which removes uncured PID material. The exposed power plane is then developed with a chemical developer such that the uncured material is removed. The signal planes, with corresponding laminated pre-impregnated (Pre-Preg) dielectric layers, are laminated onto each side of the filled power plane. The flowable dielectric in the Pre-Preg layers now only needs to fill any small cavities that may exist in the via hole area thereby improving yield and reliability.

In another embodiment, PID material is applied to both sides of a power plane with pre-formed via holes. In this embodiment, the PID material fills from both sides of the via holes. Since PID material may be on both sides of the power plane as well as in the via holes, a photo-mask is used in this embodiment. The photo-mask has holes corresponding to the via holes in the power plane. When the light source exposes the side of the power plane with the photo-mask applied, only the PID material in the via holes is exposed. The photo-mask is then removed and the unexposed PID material is chemically removed. In this manner, substantially all the material on the surfaces of the power planes is removed. One side of the via holes may have a slight build up of exposed PID material (approximately the thickness of the photo-mask); however, this covers a very small amount of the total area of the PWB. After the unexposed PID material is removed, a signal plane with a corresponding Pre-Preg dielectric layer is laminated onto each side of the power plane. One side of the power plane has no exposed PID material on the surface and the PID material in the via holes may have a slight depression depending on the penetration of the light energy when the PID material is exposed. The side of the power plane that had the photomask applied has no exposed PID material on the surface of the power planes and the via holes may have a slightly raised amount of exposed PID material. Since the raised amount of PID material is very small relative to the total area of the power plane, the Pre-Preg layer will adjust to these "bumps" while maintaining the controlled thicknesses.

A PWB is made using a conductive power plane with via holes that have been substantially filled with a PID material cured with light energy. A signal plane assembly with a conductive signal plane and a uniform thickness dielectric layer is bonded onto each side of the power plane with the PID material filled via holes forming a 2S1P PWB structure. Flowable material in the uniform dielectric layers further fills any unfilled surface areas of the filled via holes. Insulated via holes are then formed substantially through the center of the filled via holes. Conductive material is then applied to each of the insulated via holes to electrically connect the conductive signal planes. The 2S1P PWB is then completed by forming signal lines on each of the signal planes.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
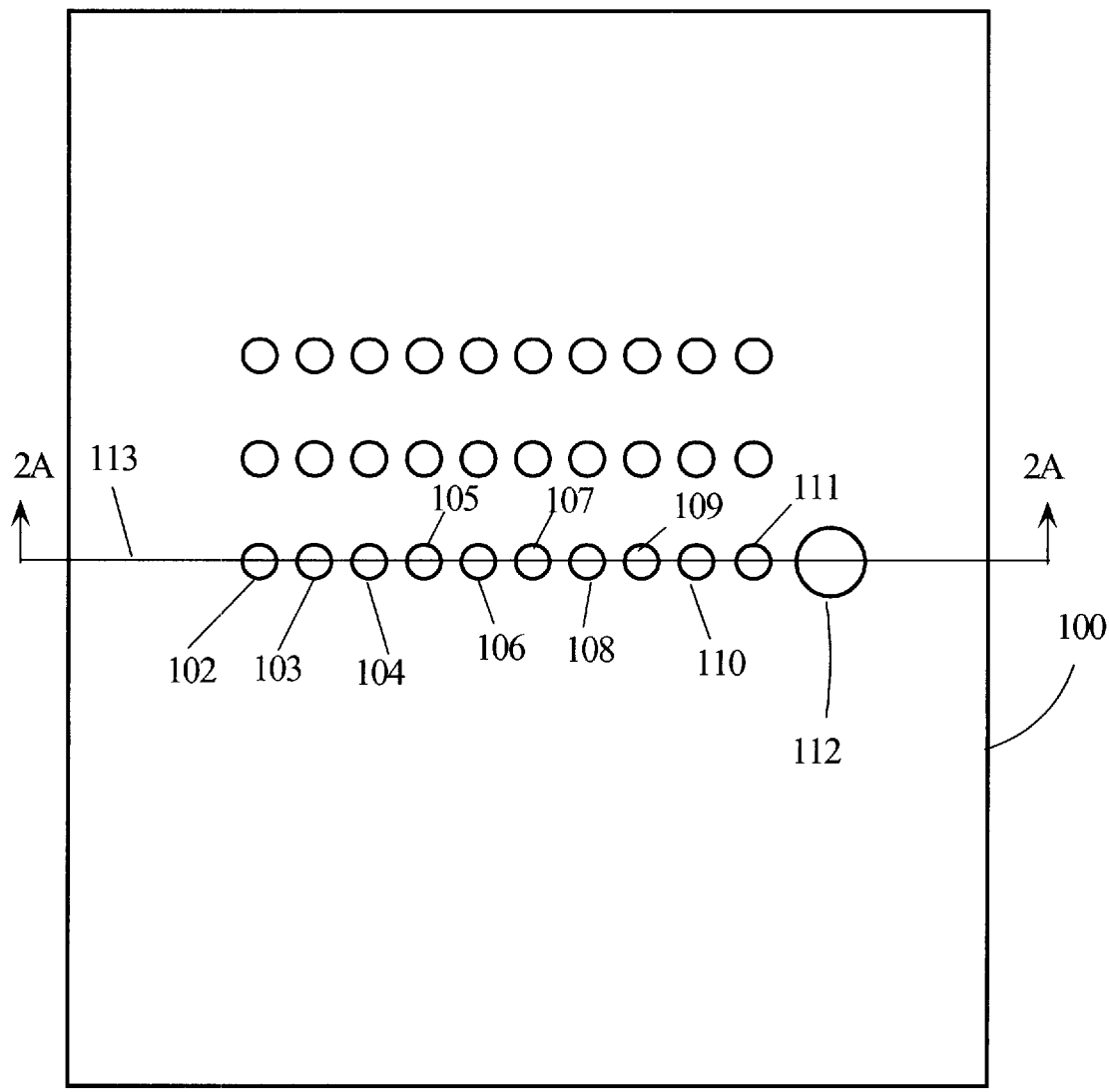
FIG. 1 is a top view of a prior art thick power plane illustrating signal and power via holes with a section line shown through a set of signal via holes and a power via hole corresponding to illustrations in succeeding figures.

In the following description, numerous specific details are set forth such as chemical compositions or process temperatures, etc. to provide a thorough understanding of the present invention. However, it will be obvious to those skilled in the art that the present invention may be practiced without such specific details. In other instances, well-known process equipment may have been shown in block diagram form in order not to obscure the present invention in unnecessary detail. For the most part, details concerning chemical compositions of known material and the like have been omitted in as much as such details are not necessary to obtain a complete understanding of the present invention and are within the skills of persons of ordinary skill in the relevant art. The term signal via holes refers to via holes that are used so conduct signals (either digital, analog or power) through power planes. Signal via holes may be synonymous the term clearance via hole.

Refer now to the drawings wherein depicted elements are not necessarily shown to scale and wherein like or similar elements are designated by the same reference numeral through the several views.

FIG. 1 illustrates a thick power plane 100 that has had signal via holes and power via holes formed by one of the various processes comprising mechanical drilling, laser drilling, punching or chemical etching. A section line 113 (2A—2A), through exemplary signal via holes 102–111 and large power via hole 112, defines a cross-section view used within succeeding FIGS. 2A–2B.

Figure 2A:
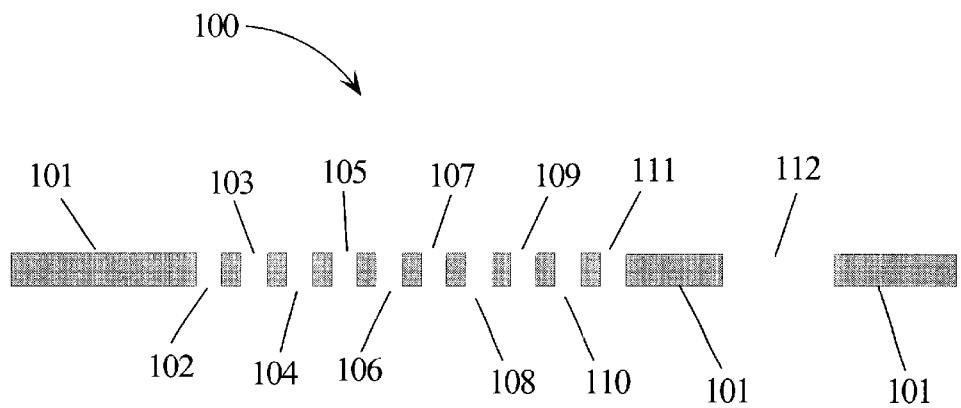
FIG. 2A is the cross-section of the prior art thick power plane shown in FIG. 1.

FIG. 2A is a cross-section view of power plane 100 defined by section line 113 (see FIG. 1). Continuous conductive plane area 101 is shown along with signal via holes 102–111 and power via hole 112. Via holes 102–111 illustrate an area of a high via hole density in conductive plane 100 where the via hole spacing is essentially equal to the smallest available via hole diameter. In some via hole patterns, the hole spacings may be smaller that the hole diameters. Via hole 112 illustrates a power via hole that is large relative to signal via holes 102–111.

Figure 2B:
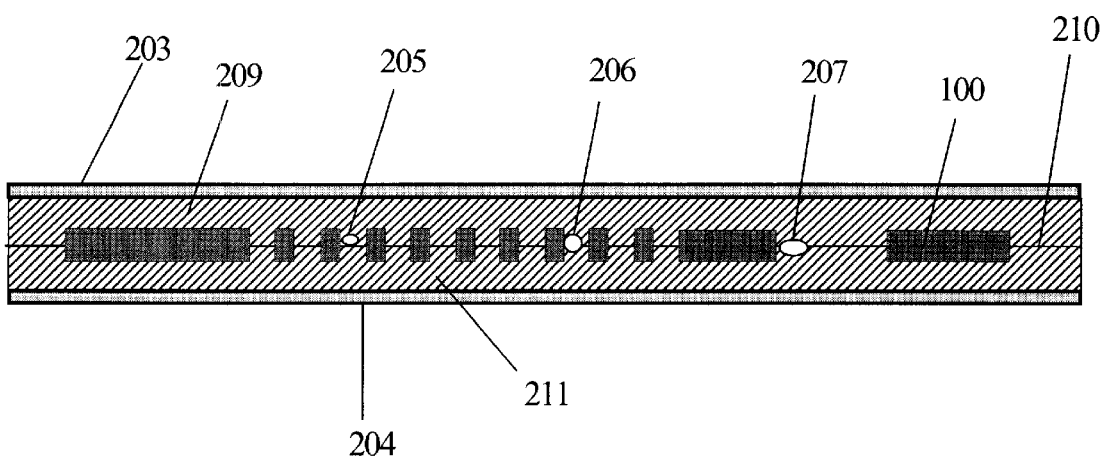
FIG. 2B is a prior art 2S1P printed wiring board (PWB) made by laminating two signal planes with corresponding pre-impregnated (Pre-Preg) dielectric material onto a pre-drilled power plane illustrating voids which may occur in the via holes.

FIG. 2B illustrates a 2S1P PWB structure 200 made with a prior art process of laminating signal planes 203 and 204 with corresponding pre-impregnated (Pre-Preg) dielectric layers 209 and 211 to thick power plane 100. Flowable dielectric material within Pre-Preg layers 209 and 211 fills the via holes 102–112 during lamination. Characteristic voids 205 and 206 may occur in the high via hole density area and characteristic void 207 may occur in the exemplary large power via hole 112. Line 210 illustrates where dielectric layers 209 and 211 meet during the lamination process corresponding to the approximate center of power plane 100.

Figure 3:
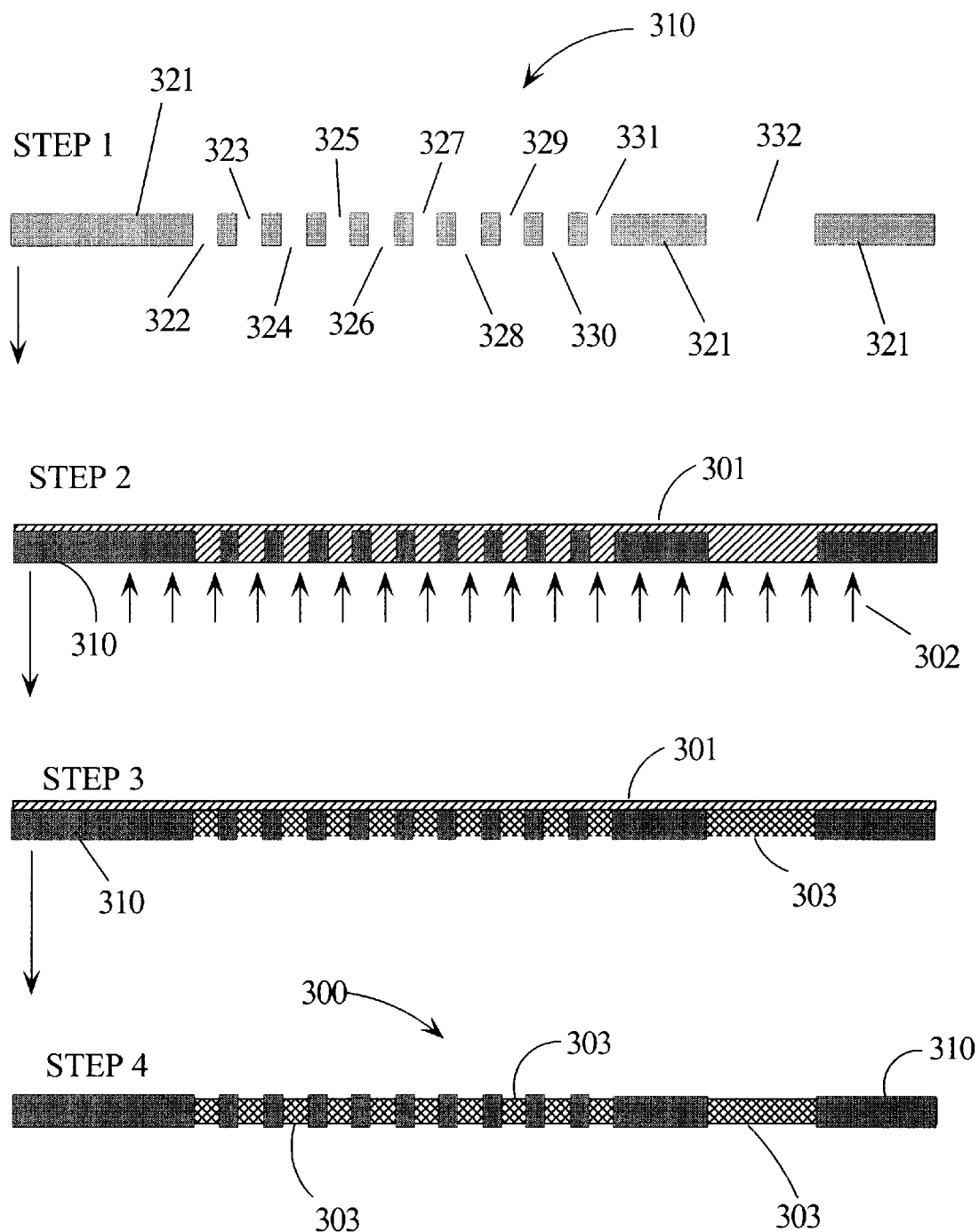
FIG. 3 illustrates four steps in a process for making a filled via hole power plane.

FIG. 3 illustrates thick power plane 310 during process steps used in filling its via holes according to one embodiment of the present invention. Step 1 illustrates a cross-section of power plane 310 showing signal via holes 322–331, power via hole 332 and continuous plane area 321. In step 2, a photo-imageable dielectric (PID) material 301 is applied to one side of power plane 310. A PID material, like ASM made by IBM Corporation or Dynavia 2000 made by Morton Electronic Materials, may be used. If IBM ASM is used, it is dried after application at 90–100 degrees centigrade for 10 to 30 minutes. PID material 301 is shown to have completely filled the via holes 322–332 of power plane 310; however, these via holes in power plane 310 may not always completely fill; rather, some amount of under filling may occur. In step 4, cured PID material 303 is shown depressed below the surface of power plane 310 illustrating holes that are not completely filled to the surfaces of power plane 310. Since the process in FIG. 3 is one sided, it is much more difficult for trapped gases to prevent PD material 301 from flowing into the via holes in power plane 310. PID material 301 may be in a liquid form and applied by screen printing or by draw coating, or in dry form and applied using a vacuum laminator such as the Dupont SMVL 130 tool. After PID material 301 has been applied in step 2, light energy 302 exposes the side of power plane 310 without applied PID material 301. If IBM ASM is used for PID material 301, ultra-violet (UV) radiation would be used as light energy 302. Following exposure to UV light, the IBM ASM material would be baked at 125 degrees centigrade for 30 to 60 minutes.

In the process of FIG. 3, power plane 310 acts as a mask preventing the PID material 301 on the surface of power plane 310 from being exposed to light energy 302. Depending on the energy level of light energy 302, PID material 301 in the via holes may be completely exposed across the thickness of power plane 310. Step 3 shows cured PID material 303 and a remaining amount of uncured PID material 301. Step 4 shows completed power plane 300 where the via holes in power plane 310 have been filled, exposed and developed thereby removing any uncured PID material 301. If PID material 301 is IBM ASM, a developer solution like gamma butylrolacetone or propylene carbonate may be used. After developing, cured PID material 303 remains in all the via holes while the surfaces of power plane 310 are substantially clear of PID material 301 or 303.

Figure 4A:
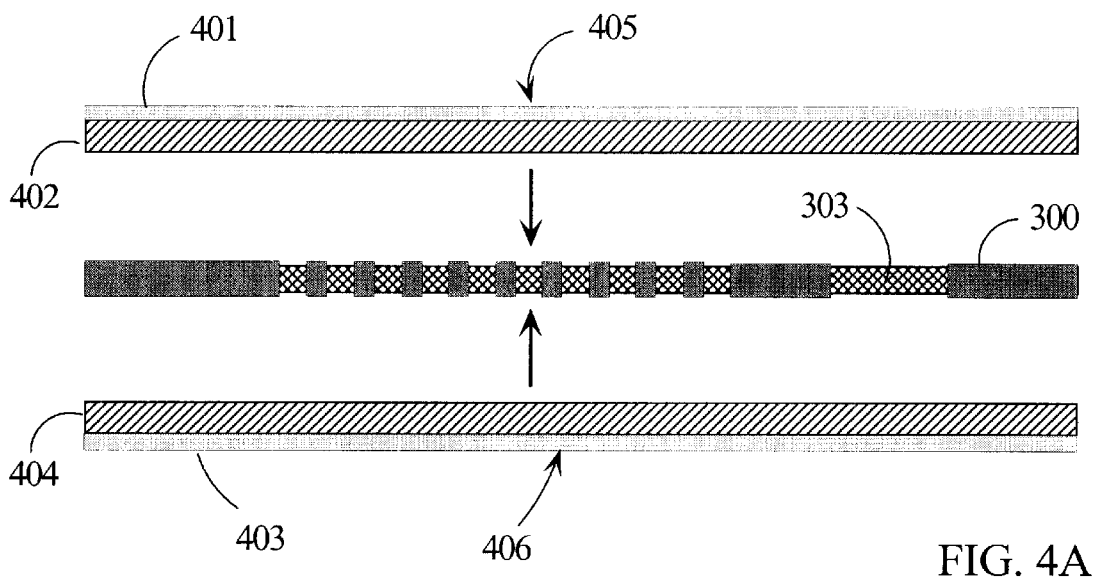
FIG. 4A illustrates two signal planes with corresponding dielectric layers placed in position prior to being laminated onto a filled via hole power plane.

FIG. 4A shows via hole filled power plane 300 with signal plane assemblies 405 and 406 in position prior to lamination. Signal plane assembly 405 comprises a conductive layer 401 and a dielectric layer (e.g., Pre-Preg) 402, and signal plane assembly 406 comprises a conductive layer 403 and a dielectric layer 404. Flowable dielectric material in dielectric layers 402 and 404 need only fill the areas not filled by cured PID material 303.

Figure 4B:
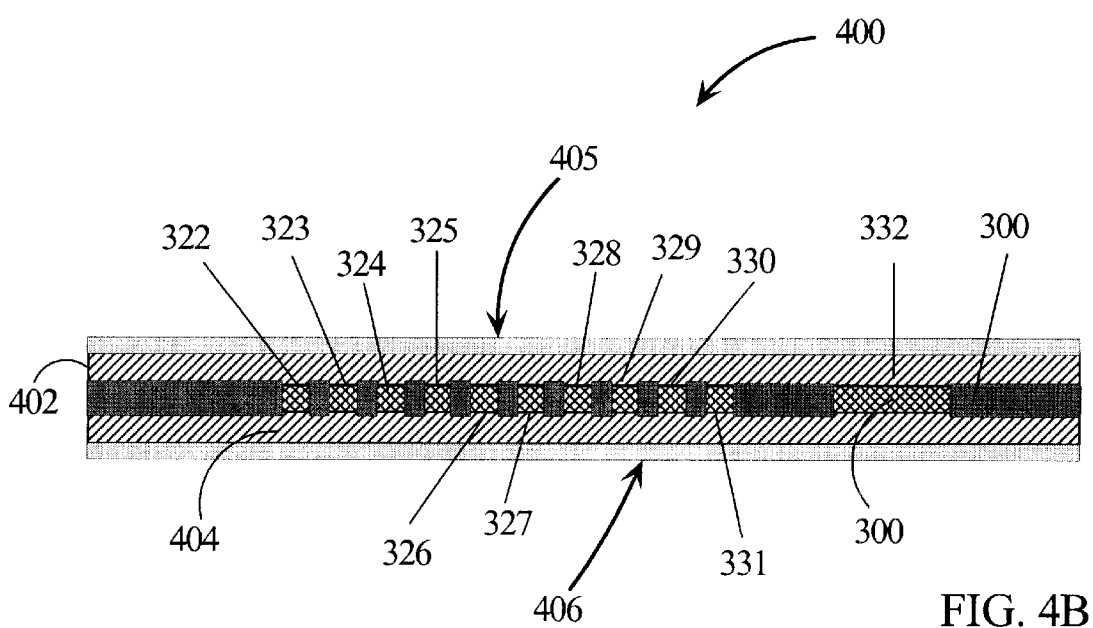
FIG. 4B illustrates a completed 2S1P-PWB structure.

FIG. 4B shows a completed 2S1P PWB 400 according to embodiments of the present invention. Signal plane assemblies 405 and 406 are ready for further processing to form signal wiring lines. Dielectric (e.g., Pre-Preg) layers 402 and 404 have been laminated and bonded to the conductive surfaces of filled power plane 300 and to the cured PID material 303 without causing voids as shown in the prior art of FIG. 2B. Signal plane assemblies 405 and 406 may also be formed using other dielectric layers other than a Pre Preg dielectric layer and still be within the scope of the present invention. Signal plane assemblies 405 and 406 may be formed with dry film dielectric using dry film lamination or a liquid dielectric material using liquid screen printing or draw coating.

Figure 5:
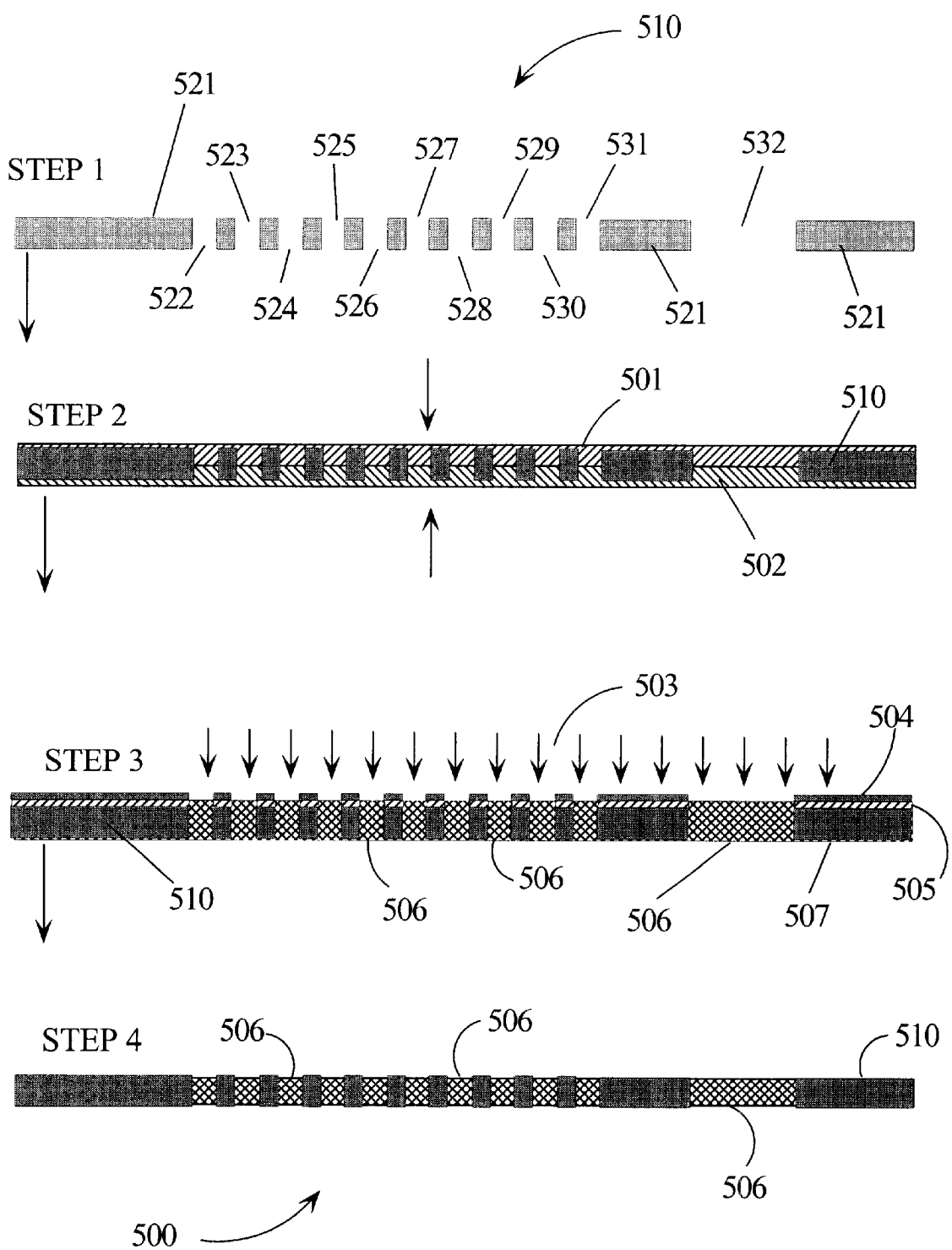
FIG. 5 illustrates four steps in another process for making a filled via hole power plane.

FIG. 5 illustrates thick power plane 510 during process steps used in filling its via holes 522–532 according to another embodiment of the present invention.

Step 1 shows a cross-section of power plane 510. Step 2 shows PID material 501 applied to one side of power plane 510 and PID material 502 applied to the other side of power plane 510. The process in step 2 of FIG. 5 may be particularly effective as power plane 510 is made increasingly thicker. In step 3, a photo-mask 504 is placed on the top side of power plane 510 and PID material 502 is exposed through photo-mask 504. A photo-mask is required because PID material 501 and 502 may be present on both sides of power plane 510 after step 2. A thin layer of PID material 505 may be trapped under photo-mask 504 and left unexposed. Light energy 503 exposes PID material 501 through photo-mask 504. Light energy 503 cures PID material 501 and 502 to form cured PID material 506 in the via holes of power plane 510. Unexposed PID material 505 under photo-mask 504 and unexposed PID material 507 are chemically removed in step 4 after photo-mask 504 is removed. The top side of filled power plane 500 may have cured PID material 506 in the via holes which is slightly above the surface of power plane 500. Likewise, the cured PID material 506 in the via holes on the bottom side of filled power plane 500 may be slightly below the surface of power plane 510. Filled power plane 500 and two signal plane assemblies (e.g., like signal plane assemblies 405 and 406) may be laminated in succeeding steps like those shown in FIGS. 4A and 4B to make a 2S1P PWB structure.

Figure 6:
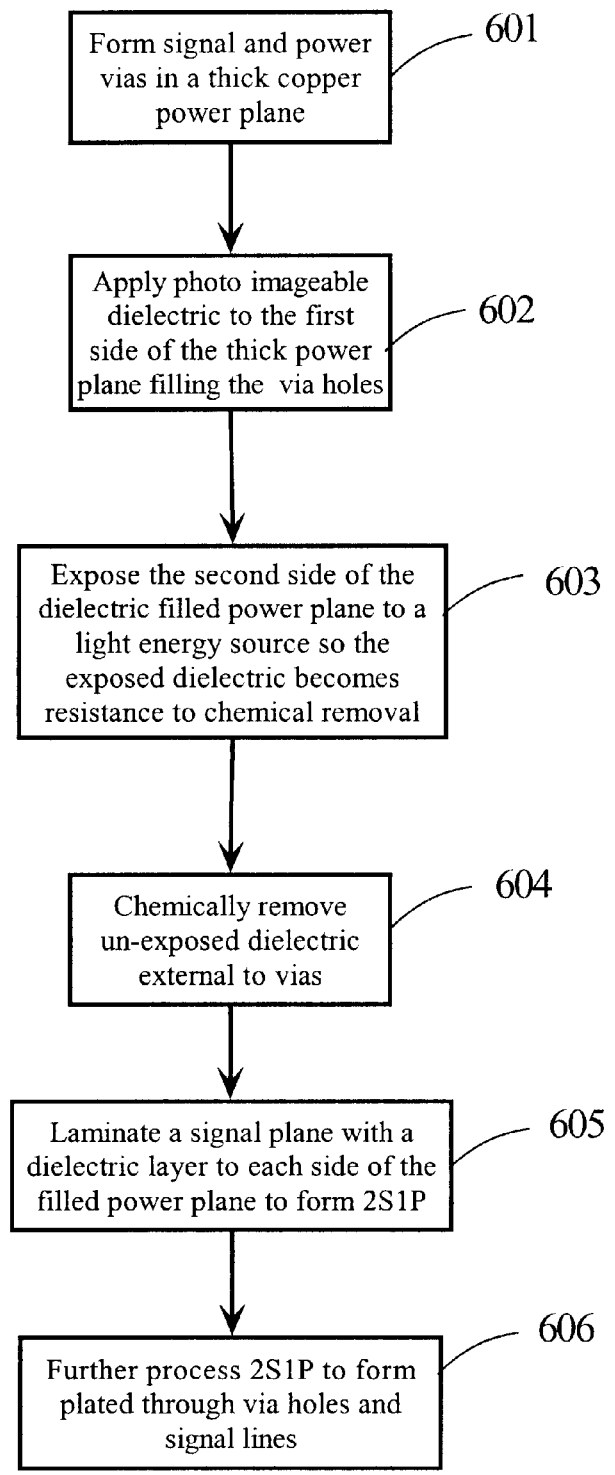
FIG. 6 is a flow diagram of process steps used in making a filled via hole power plane and a corresponding PWB.

FIG. 6 is a flow diagram of process steps in one embodiment of the present invention. In step 601, signal and power via holes are formed in a thick conductive plane making a power plane 310. In step 602, PID material 301 is applied to the first plane side of power plane 310 filling the via holes (e.g., signal via holes 322–331 and power via hole 332). In step 603, light energy 302 is used to expose the second plane side of power plane 310 where power plane 310 acts as a photo-mask to any PID material 301 on the first plane side of power plane 310. The exposed PID material 301 becomes cured PID material 303 in the via holes. In step 604, the unexposed PID material 301 is chemically removed forming filled power plane 300. In step 605, signal plane assemblies 405 and 406 are laminated onto filled power plane 300 forming a 2S1P-PWB structure 400. In step 606, the 2S1P PWB structure 400 is further processed to form plated through via holes (in filled via holes 322–332) and circuit lines (not shown) on the signal planes 401 and 403.

Figure 7:
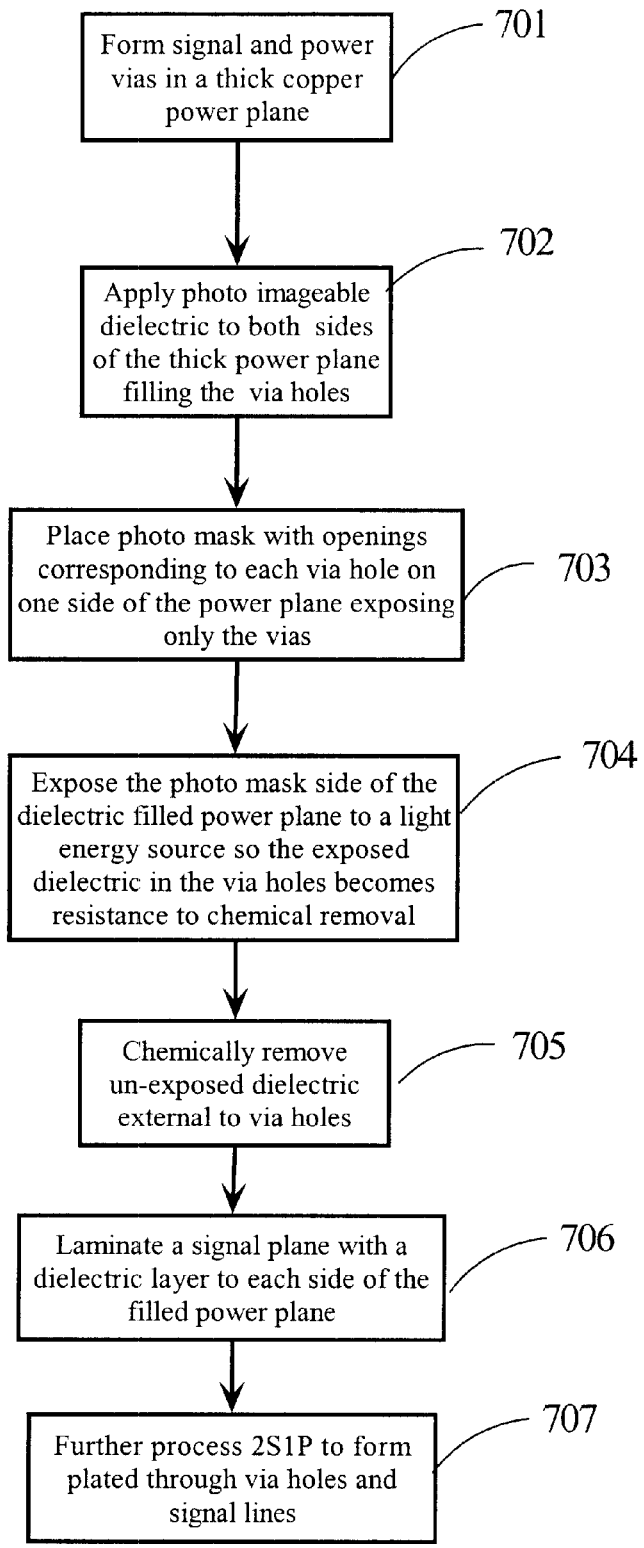
FIG. 7 is a flow diagram of process steps used in making a filled via hole power plane and a corresponding PWB.

FIG. 7 is a flow diagram of process steps in another embodiment of the present invention. In step 701, signal and power via holes are formed in a thick conductive plane making a power plane 510. In step 702, PID material 501 and 502 are applied concurrently to both sides of power plane 510 filling the via holes (e.g., signal via holes 522–531 and power via hole 532). In step 703, a photo-mask 504 with openings corresponding to each via hole is applied to one side of filled power plane 510. In step 704, light energy 503 is used to expose the side of power plane 510 with photo-mask 504. The exposed PID material 501 and 502 becomes cured PID material 506 in the via holes 522–532. In step 705, the unexposed PID material 501 on the photo-mask side and unexposed PID material 507 are chemically removed forming filled power plane 500. In step 706, signal plane assemblies 405 and 406 are laminated onto filled power plane 500 forming a 2S1P-PWB structure like 2S1P PWB structure 400. In step 707, the 2S1P PWB structure with filled power plane 500 is further processed to form conductive through via holes 522–532 and to form circuit lines (not shown) on the signal planes.

Although the present invention and its advantages have been described in detail, it should be understood that various changes, substitutions and alterations can be made herein without departing from the spirit and scope of the invention as defined by the appended claims.

What is claimed is:

1. A process for making a printed wiring board (PWB) structure comprising the steps of providing an electrically conductive power plane having a first plane side and a second plane side and one or more via holes extending through said electrically conductive power plane from said first plane side to said second plane side;

applying a photo-imageable dielectric (PID) material to said first plane side of said electrically conductive power plane substantially filling said one or more via holes forming filled via holes;

exposing said second plane side of said electrically conductive power plane to light energy to substantially cure all of said PID material in said one or more via holes forming cured PID material;

applying a developer to said electrically conductive power plane after said exposing step, said developer removing substantially all of said PID material that remains uncured after said exposing step; and laminating a first signal plane assembly to said first plane side of said electrically conductive power plane, said first signal plane assembly comprising a first electrically conductive signal plane and a first dielectric material layer having a uniform first thickness, wherein portions of said first dielectric material layer flow to fill areas of said one or more via holes not filled by said cured PID material.

2. The process of claim 1, wherein said PID material comprises IBM ASM material or Morton Electronic Materials Dynavia 2000 material.

3. The process of claim 1 further comprising the step of:

laminating a second signal plane assembly to said second plane side of said electrically conductive power plane, said second signal plane assembly comprising a second electrically conductive signal plane and a second dielectric material layer having a uniform second thickness.

4. The process of claim 3 further comprising the steps of:

forming an insulated via hole substantially in a center of each of said filled via holes by removing a cylindrical portion of said cured PID material;

applying conductive material in each said insulated via hole to electrically connect said first electrically conductive signal plane to said second electrically conductive signal plane; and forming circuit lines on said first and second electrically conductive signal planes.

5. The process of claim 3, wherein said uniform first and second thicknesses are of substantially equal value.

6. The process of claim 3, wherein portions of said second dielectric material layer flow to fill areas of said one or more via holes not filled by said cured PID material.

7. A process for making a printed wiring board (PWB) structure comprising the steps of:

providing an electrically conductive power plane having a first plane side and a second plane side and one or more via holes formed and extending through said electrically conductive power plane from said first plane side to said second plane side;

applying a photo-imageable dielectric (PID) material to said first and second plane sides of said electrically conductive power plane substantially filling said one or more via holes forming filled via holes;

placing a photo-mask on said first plane side of said electrically conductive power plane, exposing said photo-mask on said first plane side of said electrically conductive power plane to light energy to substantially cure all of said PID material in said filled via holes, applying a developer to said electrically conductive power plane after said exposing step, said developer removing substantially all of said PID material that remains uncured after said exposing step; and laminating a first signal plane assembly to said first plane side of said electrically conductive power plane, said first signal plane assembly comprising a first electrically conductive signal plane and a first dielectric material layer having a uniform first thickness, wherein portions of said first dielectric material layer flow to fill areas of said one or more via holes not filled by said cured PID material.

8. The process of claim 7, wherein said PID material comprises IBM ASM material or Morton Electronic Materials Dynavia 2000 material.

9. The process of claim 7 further comprising the step of:

laminating a second signal plane assembly to said second plane side of said electrically conductive power plane, said second signal plane assembly comprising a second electrically conductive signal plane and a second dielectric material layer having a uniform second thickness.

10. The process of claim 9 further comprising the steps of:

forming an insulated via hole substantially in a center of each of said filled via holes by removing a cylindrical portion of said cured PID material;

applying conductive material in each said insulated via hole to electrically connect said first electrically conductive signal plane to said second electrically conductive signal plane; and forming circuit lines on said first and second electrically conductive signal planes.

11. The process of claim 9, wherein said uniform first and second thicknesses are of substantially equal value.

12. The process of claim 9, wherein portions of said second dielectric material layer flow to fill areas of said one or more via holes not filled by said cured PID material.

* * * * *